United States Patent [19]

Schmidt

[11] Patent Number: 5,172,017
[45] Date of Patent: Dec. 15, 1992

[54] INTEGRATED CIRCUIT ARRANGEMENT INCLUDING A DIFFERENTIAL AMPLIFIER WHICH GENERATES A CONSTANT OUTPUT VOLTAGE OVER A LARGE TEMPERATURE RANGE

[75] Inventor: Christoph Schmidt, Igensdorf, Fed. Rep. of Germany

[73] Assignee: U.S. Philips Corporation, New York, N.Y.

[21] Appl. No.: 848,809

[22] Filed: Mar. 10, 1992

[30] Foreign Application Priority Data
Mar. 26, 1991 [DE] Fed. Rep. of Germany ....... 4109893

[51] Int. Cl.$^5$ .......................... G06G 7/10; G06G 7/12
[52] U.S. Cl. .................................. 307/494; 307/491; 307/310; 307/355
[58] Field of Search ............... 307/310, 491, 494, 355, 307/362; 330/256, 289

[56] References Cited
U.S. PATENT DOCUMENTS

| | | | |
|---|---|---|---|
| 4,968,905 | 11/1990 | Sanwo et al. | 307/310 |
| 5,008,632 | 4/1991 | Sutterlin | 330/256 |
| 5,063,311 | 11/1991 | Swapp | 307/494 |
| 5,128,564 | 7/1992 | Harvey et al. | 307/491 |

Primary Examiner—William L. Sikes
Assistant Examiner—Toan Tran
Attorney, Agent, or Firm—Robert J. Kraus

[57] ABSTRACT

Integrated circuit arrangement including a differential amplifier (1) whose outputs are coupled to a load resist arrangement (5, 7) and to a transistor (6, 8) arranged as an impedance transformer, and whose control input is coupled to a current source (4). The outputs of the differential amplifier are coupled to the outputs of a compensation differential amplifier (15). The inputs of the compensation differential amplifier are coupled to a first reference potential and the control input of the compensation differential amplifier is coupled to a second reference potential. Furthermore, a resistor arrangement (21) is coupled either to the inputs or to the control input of the compensation differential amplifier.

11 Claims, 1 Drawing Sheet

INTEGRATED CIRCUIT ARRANGEMENT INCLUDING A DIFFERENTIAL AMPLIFIER WHICH GENERATES A CONSTANT OUTPUT VOLTAGE OVER A LARGE TEMPERATURE RANGE

BACKGROUND OF THE INVENTION

The invention relates to an integrated circuit arrangement including a differential amplifier whose outputs are coupled to a load resistor arrangement and to a transistor arranged as an impedance transformer, and whose control input is coupled to a current source.

Such an integrated circuit arrangement including a differential amplifier with impedance transformers connected to its outputs is particularly used in a circuit for high frequencies, for example in the GHz range. A 2:1 multiplexer whose output circuit includes a differential amplifier with two bipolar transistors is known from the ITG Fachbericht 103, Mikroelektronik für die Informationstechnik, lectures at the ITG Conference of 3 to May 10, 1988 in Berlin, "Grundschaltungen für die optische Breitbandkommunikation bis 10 GBit/s mit einem einfachen selbstjustierenden SI-Bipolarproze{-Proze{charakterisierung und Schaltungssimulationen", H. -U. Schreiber and U. Langmann, VDE Verlag, pp. 21 to 26. The emitters of the two transistors of the differential amplifier are connected together and constitute the control input of the differential amplifier which is connected to a current source. Such a current source is generally realised by means of a transistor. The input signal is applied to the base terminals of the two transistors of the differential amplifier. A load resistor arrangement comprising a resistor and two further series-arranged bipolar transistors arranged as emitter followers (impedance transformers) are connected to the collector of each transistor (outputs of the differential amplifier). Based on the current source at the control input of the differential amplifier, the collector currents of the differential amplifier are also substantially constant in the case of a change of temperature. The direct voltage at the collectors is also substantially constant due to the constant collector currents. The base-emitter voltage of an emitter follower is dependent on the temperature. When the temperature changes, the output voltage of the integrated circuit arrangement changes as well. This change is conditioned by a change of the base-emitter voltage of the emitter follower. A base-emitter voltage change of approximately $-2$ mV/K of an emitter follower results in a voltage change of $-200$ mV for each emitter follower at the output of the differential amplifier in a range of $-20°$ C. to $80°$ C. The change of the output voltage at temperature changes may lead to unwanted conditions of operation in subsequent circuit arrangements.

SUMMARY OF THE INVENTION

The invention has therefore for its object to provide an integrated circuit arrangement including a differential amplifier which generates a substantially constant output voltage over a large temperature range.

In an integrated circuit arrangement including a differential amplifier of the type described in the opening paragraph this object is achieved in that the outputs of the differential amplifier are coupled to the outputs of a compensation differential amplifier, in that the inputs of the compensation differential amplifier are coupled to a first reference potential and the control input of the compensation differential amplifier is coupled to a second reference potential, and in that a resistor arrangement is coupled either to the inputs or to the control input of the compensation differential amplifier.

The control input of the compensation differential amplifier is coupled to a second reference potential and the inputs are coupled to a first reference potential. Either the control input or the inputs of the compensation differential amplifier are connected to a resistor arrangement. The current supplied to the control input is evenly distributed over the two outputs. A change of temperature causes a change of voltage between the input and the control input of the transistors in the compensation differential amplifier. The output currents of the compensation differential amplifier also change. If bipolar transistors are used in the compensation differential amplifier, the base-emitter voltage of the transistors and the collector currents change when there is a change of temperature. The collector currents of the compensation differential amplifier are superimposed on the respective collector currents of the differential amplifier. If a bipolar transistor (emitter follower) arranged as an impedance transformer is connected to each output of the differential amplifier, its base-emitter voltage changes when there is a change of temperature. The changed collector current produced by the compensation differential amplifier in the case of a change of temperature produces an opposite voltage in the respective load resistor arrangements so that an output voltage is obtained which substantially corresponds to the output voltage without any change of temperature. The integrated circuit arrangement may alternatively be realised with field effect transistors.

The inputs of the compensation differential amplifier may be directly connected to the first reference potential if there is no resistor arrangement at the inputs. However, a suitable setting may alternatively be realised by means of two resistors. In this case a resistor arrangement is arranged between the control input of the compensation differential amplifier and the second reference potential, while terminals of a first and a second resistor are coupled to the inputs of the compensation differential amplifier, the other terminal of the first resistor is connected to the first reference potential and the other terminal of the second resistor is coupled to a third reference potential. The first and the second reference potential should be equal for reasons of simplification. The third reference potential may be the ground terminal.

A simple resistor arrangement is obtained if it includes a third resistor. If the compensation differential amplifier is realised with bipolar transistors, the third resistor may be connected at one end to the emitters of the two bipolar transistors and at the other end to the second reference potential.

If the integrated circuit arrangement is used for special applications, predetermined output voltages which are dependent on the temperature may be desired. Such a different temperature-dependent output voltage can be realised if the first and/or the second resistor have a predetermined temperature dependence. A further possibility is realised if the third resistor has a predetermined temperature dependence.

A further decrease of the impedance at the output of the integrated circuit arrangement can be achieved if at least one further transistor arranged as an impedance transformer is connected in series with each transistor arranged as an impedance transformer. If this further transistor is a bipolar transistor, a change of temperature results in a change of the base-emitter voltage. This additional voltage change can be compensated for if at least one diode arrangement is connected between the second resistor and the inputs of the compensation differential amplifier. This diode arrangement is also temperature-dependent and produces additional compensation currents in the compensation differential amplifier. Such a diode arrangement may include a transistor arranged as a diode. Further series-arranged diodes for temperature compensation of further impedance transformers may be present in the diode arrangement.

A further temperature-dependent output voltage can be achieved if the transistors of the compensation differential amplifier have different geometrical dimensions than the transistors arranged as impedance transformers.

The values of the load resistor arrangement and the values of the transistors of the differential amplifier depend on the desired amplification. The resistance values of the load resistor arrangements may be so large that there is overcompensation of the output voltage, i.e. an opposite output voltage change is the result when the temperature changes. To avoid this, each load resistor arrangement includes a fourth and a fifth resistor which are arranged in series and have their common junction points connected to the outputs of the compensation differential amplifier. The two resistors should be chosen in such a way that the voltage change conditioned by the temperature change is exactly compensated for.

BRIEF DESCRIPTION OF THE DRAWING

An embodiment of the invention will now be described in greater detail with reference to the accompanying drawing figures in which.

DESCRIPTION OF THE PREFERRED EMBODIMENT

Figure 1:
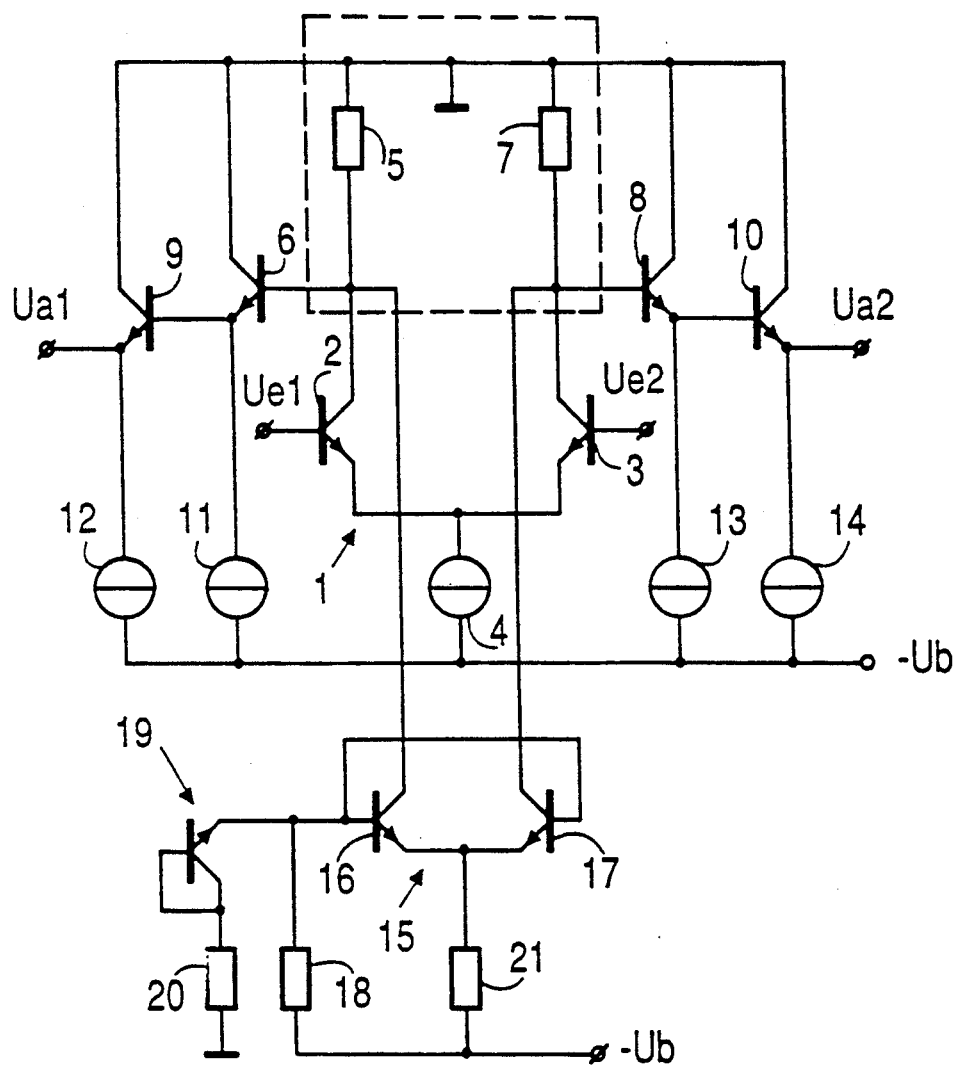
FIG. 1 shows a circuit arrangement to be integrated, including a differential amplifier and a compensation differential amplifier for temperature compensation.

The circuit arrangement to be integrated, shown in FIG. 1, includes a differential amplifier 1 with two transistors 2 and 3. The two transistors 2 and 3 of the differential amplifier 1 and the subsequent transistors described and shown in the Figures represent NPN bipolar transistors. The two emitters of the transistors 2 and 3 are connected together and constitute a control input to which a first terminal of a current source 4 is connected. The base terminals of the transistors 2 and 3 constitute the inputs of the differential amplifier 1. An input voltage $U_{e1}$ is applied to the base of the transistor 2 and an input voltage $U_{e2}$ is applied to the base of transistor 3. The respective collector terminals of the transistors 2 and 3 constitute the outputs of the differential amplifier 1. The collector of the transistor 2 is connected to a first terminal of a load resistor arrangement 5 and the base of a transistor 6. The collector of the transistor 3 constitutes a common junction with a first terminal of a further load resistor arrangement 7 and the base of a transistor 8. The load resistor arrangements 5 and 7 are realised by means of resistors. Each second terminal of the load resistor arrangements 5 and 7 is connected to ground.

The transistors 6 and 8 are arranged in series with further transistors 9 and 10, respectively. The transistors 6, 8, 9 and 10 are arranged as emitter followers for the purpose of impedance transformation. The collectors of the transistors 6, 8, 9 and 10 are connected to ground. The emitter of transistor 6 is connected to the base of transistor 9 and to the first terminal of a current source 11. The emitter of the transistor 9 supplies an output voltage $U_{a1}$ and is connected to a first terminal of a current source 12. The emitter of the transistor 8 is connected to the base of the transistor 10 and to a first terminal of a current source 13. The emitter of the transistor 10 supplies a second output voltage $U_{a2}$ and is connected to a first terminal of a current source 14. The second terminals of the current sources 4, 11, 12, 13 and 14 are connected to a power supply voltage $-U_b$.

The load resistor arrangements 5 and 7 and the transistors 2 and 3 of the differential amplifier 1 are chosen to be such that a given amplification is realised with the circuit arrangement. If the temperature changes, the base-emitter voltages of the transistors 6, 8, 9 and 10 change as well. The collector currents of the transistors 2 and 3 remain substantially constant, also when the temperature changes, because the collector currents are essentially derived from the current source 4. The change of the base-emitter voltages of the transistors 6, 8, 9 and 10, produced in the case of a change of temperature, changes the output voltages $U_{a1}$ and $U_{a2}$.

A compensation differential amplifier 15 is provided to compensate for the temperature-conditioned changes of the output voltages $U_{a1}$ and $U_{a2}$. The compensation differential amplifier 15 includes two transistors 16 and 17 whose emitters are connected together and represent a control input. The base terminals of the two transistors 16 and 17 represent the inputs of the compensation differential amplifier 15. The base terminals of the transistors 16 and 17 are interconnected to a first terminal of a first resistor 18 and to a diode arrangement 19. The diode arrangement includes a transistor arranged as a diode, whose emitter is connected to the first terminal of the first resistor 18. The collector and the base of the transistor in the diode arrangement 19 are connected to the first terminal of a second resistor 20. The second terminal of the second resistor 20 is connected to ground. The control input of the compensation differential amplifier 15 is connected to a first terminal of a third resistor 21. The second terminal of the first resistor 18 and the second terminal of the third resistor 21 are connected to the power supply voltage $-U_b$.

If there is a change of temperature, the base-emitter voltages and the collector currents of the transistors 16 and 17 also change. These collector currents are superimposed on the collector currents of the transistors 2 and 3 of the differential amplifier 1. The result is a changed voltage at the load resistor arrangements 5 and 7, which voltage opposes the base-emitter voltage change of the transistors 6 and 9, and 8 and 10. A compensation of the base-emitter voltage change of the transistors 6 and 8 can generally be achieved with the transistors 16 and 17 of the compensation differential amplifier 15. The diode arrangement 19 is provided to compensate for the further base-emitter voltage change of the transistors 9 and 10. Thus a substantial compensation of the base-emitter voltage changes of the transistors 6, 8, 9 and 10 in the case of a temperature change can be realised by means of the compensation differential amplifier 15 and the diode arrangement 19.

In certain applications a given dependence of the output voltages $U_{a1}$ and $U_{a2}$ on the temperature is additionally desired. These dependences can be realised by means of the resistors 18, 20 and 21 if they have a predetermined temperature dependence. A further additional effect can be achieved if the transistors 16 and 17 of the compensation differential amplifier 15 have geometrical dimensions which are different from those of the transistors 2 and 3 of the differential amplifier 1.

Figure 2:
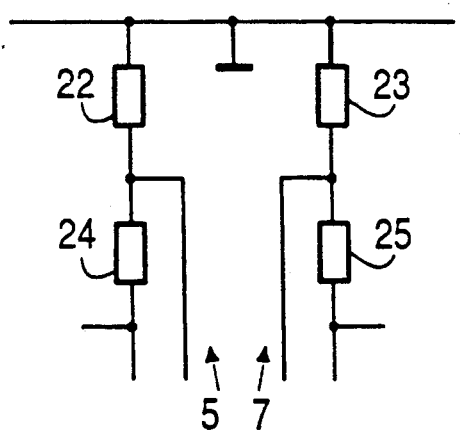
FIG. 2 shows two load resistor arrangements to be used for the differential amplifier shown in FIG. 1.

As stated hereinbefore, the load resistor arrangements 5 and 7 and the transistors 2 and 3 are dimensioned in such a way that a given amplification can be achieved. The load resistor arrangements 5 and 7 may then have such resistance values that there is an overcompensation in the case of a change of temperature. To counteract such an overcompensation, the resistors in the load resistor arrangements 5 and 7 are realised by two fourth resistors 22 and 23 and two fifth resistors 24 and 25, respectively. The first terminal of the fifth resistor 24 is connected to the base of the transistor 6 and to the collector of the transistor 2 and the second terminal of the fifth resistor 24 is connected to the collector of the transistor 16 and to the first terminal of the fourth resistor 22. The first terminal of the fifth resistor 25 is connected to the base of the transistor 8 and to the collector of the transistor 3 and the second terminal of the fifth resistor 25 is connected to the collector of the transistor 17 and to the first terminal of the fourth resistor 23. The second terminals of the fourth resistors 22 and 23 are connected to ground. The changed collector currents of the compensation differential amplifier generate a voltage change in the load resistor arrangements 5 and 7 when there is a change of temperature. This voltage change is determined by the resistors 22 and 23 in the arrangement shown in FIG. 2.

I claim:

1. An integrated circuit arrangement including a first differential amplifier having output means coupled to a load resistance arrangement and to a transistorized impedance transformer, and having control input means coupled to a current source;
   characterized in that the output means of the differential amplifier is coupled to output means of a compensation differential amplifier, input means of the compensation differential amplifier is coupled to a first reference potential source, control input means of the compensation differential amplifier is coupled to a second reference potential source, and resistance means is coupled to at least one of the input means and the control input means of the compensation differential amplifier.

2. An integrated circuit arrangement including a first differential amplifier having first and second outputs coupled to respective first and second load resistance arrangements and to respective first and second inputs of a transistorized impedance transformer, and having a control input coupled to a current source, characterized in that:
   a. said first and second outputs are coupled to respective first and second outputs of a compensation differential amplifier;
   b. the compensation differential amplifier has input means and control input means coupled to respective first and second reference potential sources; and
   c. at least one of the input means and the control input means is coupled to the respective reference potential source through a resistance means.

3. An integrated circuit arrangement as in claim 1 or 2 where the resistance means includes:
   a. a first resistor coupling the input means of the compensation differential amplifier to the first reference potential source;
   b. a second resistor coupling the input means of the compensation differential amplifier to a third reference potential source; and
   c. a third resistor coupling the control input means of the compensation differential amplifier to the second reference potential source.

4. An integrated circuit arrangement as in claim 3 where at least one of the first and second resistors has a predetermined temperature dependence.

5. An integrated circuit arrangement as in claim 3 where the third resistor has a predetermined temperature dependence.

6. An integrated circuit arrangement as in claim 2 where the transistorized impedance transformer includes first and second pairs of cascaded transistor stages, each of said pairs being coupled to a respective one of the first and second inputs of said impedance transformer.

7. An integrated circuit arrangement as in claim 3 including diode means through which the second resistor is coupled to the input means of the compensation differential amplifier.

8. An integrated circuit arrangement as in claim 7 where the diode means comprises a transistor connected as a diode.

9. An integrated circuit arrangement as in claim 1 or 2 where transistors of the compensation differential amplifier have different geometrical dimensions than transistors of the impedance transformer.

10. An integrated circuit arrangement as in claim 2 where each of the first and second load resistance arrangements comprises a pair of serially connected resistors having a common junction point electrically connected to a respective one of the first and second outputs of the compensation differential amplifier.

11. An integrated circuit arrangement as in claim 1 or 2 where the first and second reference potentials are equal.

* * * * *